United States Patent
Xing et al.

(10) Patent No.: US 10,203,787 B2
(45) Date of Patent: Feb. 12, 2019

(54) TOUCH DISPLAY DEVICE AND IMPROVEMENT METHOD THEREFOR

(71) Applicant: Wuhan China Star Optoelectronics Technology Co. Ltd., Wuhan, Hubei (CN)

(72) Inventors: Zhenzhou Xing, Guangdong (CN); Chunpeng Guo, Guangdong (CN); Man Li, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 196 days.

(21) Appl. No.: 15/127,459

(22) PCT Filed: Aug. 17, 2016

(86) PCT No.: PCT/CN2016/095705
§ 371 (c)(1),
(2) Date: Sep. 20, 2016

(87) PCT Pub. No.: WO2018/010248
PCT Pub. Date: Jan. 18, 2018

(65) Prior Publication Data
US 2018/0217705 A1    Aug. 2, 2018

(30) Foreign Application Priority Data
Jul. 15, 2016   (CN) .......................... 2016 1 0560368

(51) Int. Cl.
*G06F 3/041*        (2006.01)
*G02F 1/1333*       (2006.01)
(Continued)

(52) U.S. Cl.
CPC ........ *G06F 3/0412* (2013.01); *G02F 1/13338* (2013.01); *G02F 1/136213* (2013.01);
(Continued)

(58) Field of Classification Search
CPC .... G06F 3/0412; G06F 3/0418; G06F 3/0416; G02F 1/13338; G02F 1/136213; G02F 1/136286; H01L 27/124; G09G 3/36
See application file for complete search history.

(56) References Cited

U.S. PATENT DOCUMENTS 8,228,394 B2   7/2012   Lin
9,285,933 B2   3/2016   Kim
(Continued)

FOREIGN PATENT DOCUMENTS

CN   103050108 A   4/2013
CN   204178287 U   2/2015
(Continued)

*Primary Examiner* — Dmitriy Bolotin
(74) *Attorney, Agent, or Firm* — Andrew C. Cheng

(57) ABSTRACT

A touch display device and an improvement method to a touch display device are disclosed. The improvement method first determines whether the touch display device turns on the touch mode. If yes, image data input to the touch display device is obtained and feature data is extracted from the image data. Then, adjustment or compensation factors are obtained according to the feature data. Grey level compensation sequence is also obtained. The duty cycle of the control signal for the touch display device is adjusted according to the factors and the grey level compensation sequence, so as to improve the display difference for a same grey level image due to the turning on of the touch mode.

13 Claims, 3 Drawing Sheets

(51) Int. Cl.
*G02F 1/1362* (2006.01)
*H01L 27/12* (2006.01)
*G09G 3/36* (2006.01)

(52) U.S. Cl.
CPC ...... *G02F 1/136286* (2013.01); *G06F 3/0416* (2013.01); *G06F 3/0418* (2013.01); *G09G 3/36* (2013.01); *H01L 27/124* (2013.01)

(56) References Cited

U.S. PATENT DOCUMENTS

| | | | |
|---|---|---|---|
| 9,564,094 B2 | 2/2017 | Li | |
| 2014/0240367 A1* | 8/2014 | Kim | G09G 3/3648 345/690 |
| 2015/0371593 A1* | 12/2015 | Hesselmark | G09G 3/3413 345/440 |
| 2016/0027146 A1* | 1/2016 | Kim | H04N 19/44 345/629 |
| 2016/0189636 A1* | 6/2016 | Liu | G09G 3/3406 345/690 |
| 2016/0284279 A1* | 9/2016 | Li | G09G 3/3406 |
| 2016/0351104 A1* | 12/2016 | Yaras | G09G 3/2022 |

FOREIGN PATENT DOCUMENTS

| | | |
|---|---|---|
| CN | 104575443 A | 4/2015 |
| JP | 2004245949 A | 3/2006 |

* cited by examiner

TOUCH DISPLAY DEVICE AND IMPROVEMENT METHOD THEREFOR

BACKGROUND OF THE INVENTION

1. Field of the Invention

The present disclosure generally relates to display techniques, and particularly relates to a touch display device and a method for improving a touch display device.

2. The Related Arts

Mainstream display panels are touch-sensitive and most of them are capacitive touch panels. For capacitive touch panels, a capacitive change resulted from finger approaching and touching the touch panel is pick up and coordinates to the touch location is determined accordingly. There are three major types of touch panels: out-cell, on-cell, and in-cell. The development trend focuses on the in-cell techniques.

According to existing in-cell techniques, a same image would encounter different grey levels when the touch function is turned on and turned off. Therefore the same image would be displayed differently.

SUMMARY OF THE INVENTION

The objective of the present disclosure is to provide a touch display device and an improvement method to a touch display device so as to resolve the foregoing problem.

To achieve the objective, a technical solution taught by the present disclosure is an improvement method for a touch display device. The method includes the following steps:

determining whether the touch display device turns on the touch mode;

if yes, obtaining image data input to the touch display device and extracting feature data from the image data;

obtaining adjustment or compensation factors according to the feature data;

obtaining multiple first brightness values, each corresponding to a grey level when the touch display device does not turn on the touch mode;

obtaining multiple second brightness values, each corresponding to a grey level when the touch display device turns on the touch mode;

obtaining multiple absolute values of the differences of the first brightness values and the corresponding second brightness values;

obtaining grey level compensation sequence according to the grey levels and the absolute values;

adjusting the duty cycle of the touch display device's control signal according to the factors and the grey level compensation sequence; and adjusting a backlight module's brightness of the touch display device according to the control signal of adjusted duty cycle.

The improvement method further includes the following steps:

if no, obtaining image data and extracting feature data from the image data;

obtaining adjustment or compensation factors according to the feature data; and adjusting the duty cycle of the touch display device's control signal according to the factors.

The improvement method further provides compensation to the touch display device's liquid crystals according to the factors.

To achieve the above objective, a technical solution taught by the present disclosure is another improvement method for a touch display device. The method includes the following steps:

determining whether the touch display device turns on the touch mode;

if yes, obtaining image data input to the touch display device and extracting feature data from the image data;

obtaining adjustment or compensation factors according to the feature data; and obtaining grey level compensation sequence and adjusting the duty cycle of the touch display device's control signal according to the factors and the grey level compensation sequence.

Obtaining grey level compensation sequence includes the following steps;

obtaining multiple first brightness values, each corresponding to a grey level when the touch display device does not turn on the touch mode;

obtaining multiple second brightness values, each corresponding to a grey level when the touch display device turns on the touch mode;

obtaining multiple absolute values of the differences of the first brightness values and the corresponding second brightness values; and obtaining the grey level compensation sequence according to the grey levels and the absolute values.

The improvement method further includes the following steps;

if no, obtaining image data and extracting feature data from the image data;

obtaining adjustment or compensation factors according to the feature data; and adjusting the duty cycle of the touch display device's control signal according to the factors.

The improvement method further includes the step:

adjusting a backlight module's brightness of the touch display device according to the control signal of adjusted duty cycle.

The improvement method further includes the step:

providing compensation to the touch display device's liquid crystals according to the factors.

To achieve the above objective, a technical solution taught by the present disclosure is a touch display device including a processing chip and a display panel. The processing chip determines whether the touch display device turns on the touch mode. If yes, the processing chip obtains image data input to the touch display device and extracts feature data from the image data. The processing chip then obtains adjustment or compensation factors according to the feature data. The processing chip further obtains grey level compensation sequence. The processing chip then adjusts the duty cycle of the touch display device's control signal according to the factors and the grey level compensation sequence.

To obtain the grey level compensation sequence, the processing chip obtains first brightness values, each corresponding to a grey level when the touch display device does not turn on the touch mode. The processing chip then obtains second brightness values, each corresponding to a grey level when the touch display device turns on the touch mode. The processing chip then obtains an absolute value of the difference between a first brightness value and a second brightness value, both corresponding to a same grey level. The processing chip then obtains the grey level compensation sequence according to the grey levels and the corresponding absolute values.

If the processing chip determines that the touch display device does not turn on the touch mode, the processing chip obtains image data and extracts feature data from the image data. The processing chip then obtains adjustment or compensation factors according to the feature data. The processing chip then adjusts the duty cycle of the touch display device's control signal according to the factors.

The touch display device further includes a backlight module providing illumination to the display panel. The processing chip adjusts the backlight module's brightness according to the control signal of adjusted duty cycle.

The processing chip further provides compensation to the touch display device's liquid crystals according to the factors.

In contrast to the prior art, the present disclosure first determines whether the touch display device turns on the touch mode. If yes, image data input to the touch display device is obtained and feature data is extracted from the image data. Then, adjustment or compensation factors are obtained according to the feature data. Grey level compensation sequence is also obtained. The duty cycle of the control signal for the touch display device is adjusted according to the factors and the grey level compensation sequence, so as to increase the brightness of the touch display device's backlight module. Therefore the problem of display difference for a same grey level image due to the turning on of the touch mode is improved.

BRIEF DESCRIPTION OF THE DRAWINGS

To make the technical solution of the embodiments according to the present disclosure, a brief description of the drawings that are necessary for the illustration of the embodiments will be given as follows. Apparently, the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

Figure 1:
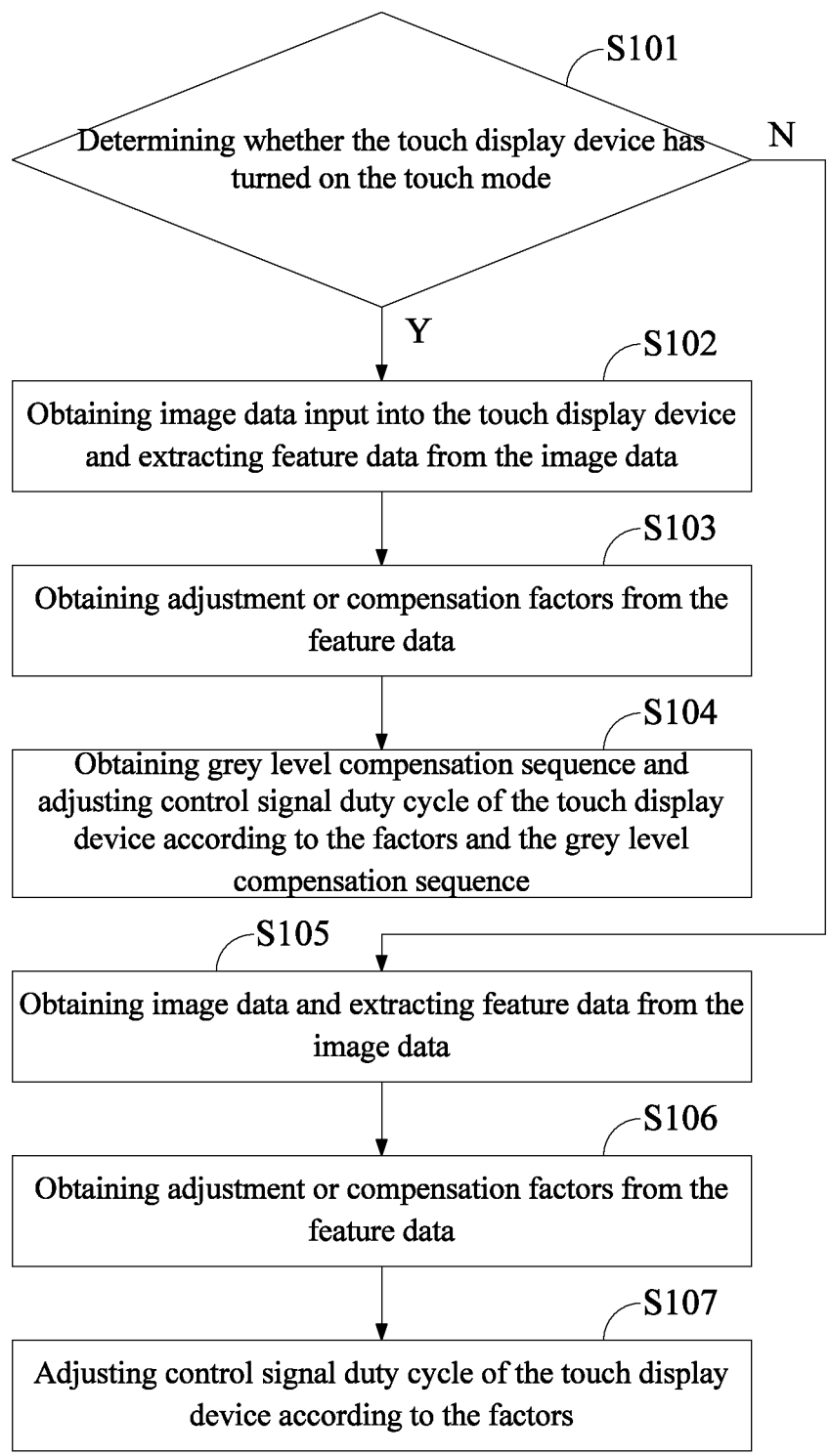
FIG. 1 is a flow diagram showing an improvement method for a touch display device according to an embodiment of the present disclosure.
Figure 2:
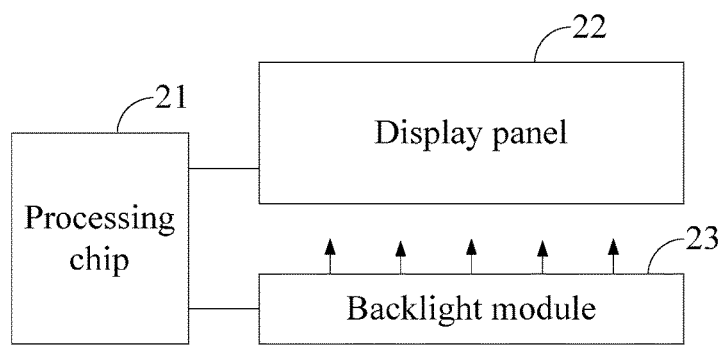
FIG. 2 is a schematic diagram showing the structure of the touch display device of FIG. 1.

FIG. 1 is a flow diagram showing an improvement method for a touch display device according to an embodiment of the present disclosure. FIG. 2 is a schematic diagram showing the structure of the touch display device of FIG. 1. The improvement method is for improving the display of a touch display device which preferably is an in-cell touch display device.

As shown in FIG. 2, the touch display device 20 includes a processing chip 21, a display panel 22, and a backlight module 23. The processing chip 21 is respectively connected to the display panel 22 and the backlight module 23 for driving them to operate. The backlight module 23 provides illumination to the display panel 22.

Figure 3:
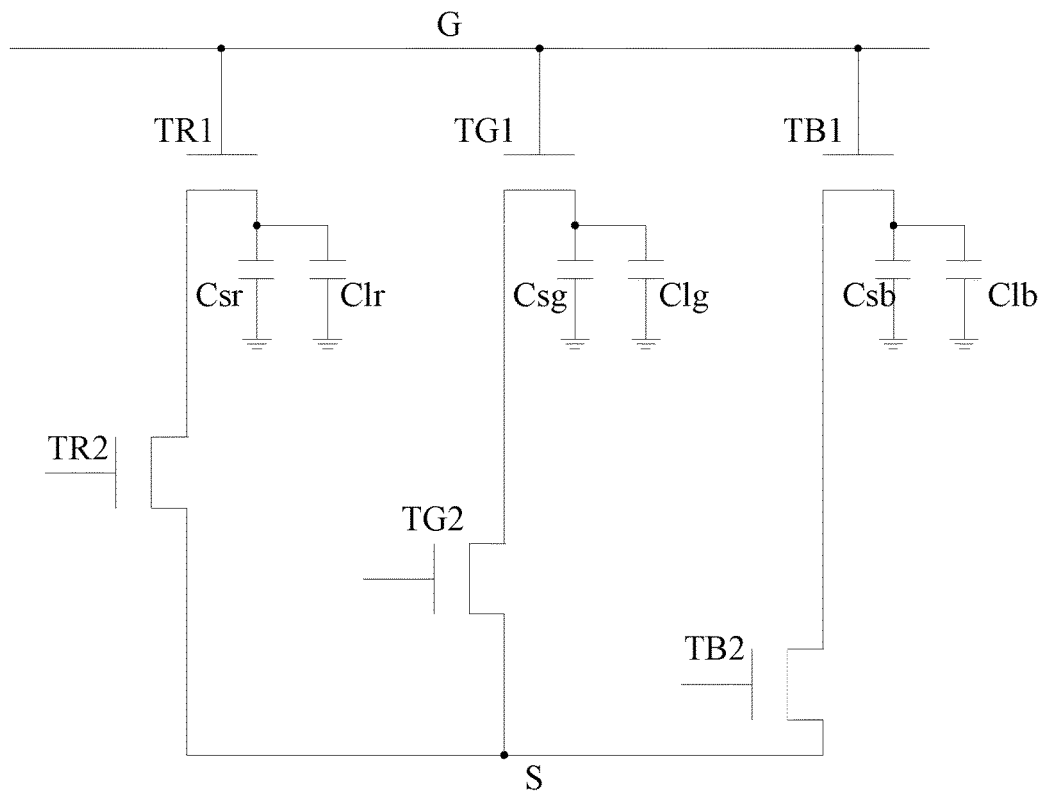
FIG. 3 is a schematic diagram showing an equivalent circuit for a pixel unit of the touch display device of FIG. 1.

FIG. 3 is a schematic diagram showing an equivalent circuit for a pixel unit of the touch display device 20 of FIG. 1. The equivalent circuit includes a scan line G, thin film transistors (TFTs) TR1, TG1, TB1, TR2, TG2, and TB2, storage capacitors Csr, Csg, and Csb, liquid crystal capacitors Clr, Clg, and Clb. The gates of the TFTs TR1, TG1, and TB1 are connected to the scan line G. The TFT TR1 has its source connected to a source line S through the TFT TR2 and its drain connected to an end of the storage capacitor Csr and an end of the storage capacitor Clr. Another ends of the storage capacitors Csr and Clr are connected to ground. The TFT TG1 has its source connected to the source line S through the TFT TG2 and its drain connected to an end of the storage capacitor Csg and an end of the storage capacitor Clg. Another ends of the storage capacitors Csg and Clg are connected to ground. The TFT TB1 has its source connected to the source line S through the TFT TB2 and its drain connected to an end of the storage capacitor Csb and an end of the storage capacitor Clb. Another ends of the storage capacitors Csb and Clb are connected to ground.

When a touch mode of the touch display device 20 is turned on, the scan line G's low voltage level cannot turn off the TFTs TR1, TG1, and TB1. At the moment, the TFTs TR2, TG2, and TB2 are turned on and the pixel unit's voltage level is discharged through the source line S, thereby causing differences for a same grey level image display.

As shown in FIG. 1, the improvement method includes the following steps.

Step S101: Determining whether the touch display device 20 has turned on the touch mode.

The processing chip 21 is used to conduct the determination.

Step S102: If yes, obtaining image data input into the touch display device 20 and extracting feature data from the image data.

When the processing chip 21 determines that the touch display device 20 has turned on the touch mode, the processing chip 21 obtains image data sent to the touch display device 20 and extracts feature data from the image data.

Step S103: Obtaining adjustment or compensation factors from the feature data.

The processing chip 21 calculates and obtains adjustment or compensation factors from the feature data.

Preferably steps S102 and S103 are achieved through Content Adaptive Backlight Control (CABC) technique. CABC automatically adjusts panel brightness so as to reduce power consumption. For example, the display panel 22's image grey levels are raised 30% while the backlight module 23's brightness is reduced 30%. The display effect remains the same whereas the reduction of the backlight module 23's brightness leads to 30% reduction of the power consumption.

More specifically, feature data is first extracted from the image data. Factors required for adjusting backlight is calculated and obtained. Duty cycle of the backlight control signal is adjusted according to the factors so as to control the brightness of the backlight module 23. On the other hand, liquid crystals are compensated according to the obtained factors so as to increase the image grey levels. Finally, both adjustment and compensation are input into the display panel 21 to display image, thereby achieving CABC adjustment.

Step S104: Obtaining grey level compensation sequence and adjusting control signal duty cycle of the touch display device according to the factors and the grey level compensation sequence.

The processing chip 21 obtains the grey level compensation sequence and adjusts the duty cycle of the control signal of the touch display device 20 according to the factors and the grey level compensation sequence. The control signal is for controlling the brightness of the backlight module 23. In other words, the processing chip 21 controls the brightness of the backlight module 23 according to the adjusted control signal.

In addition, the processing chip 21 further provides compensation to the liquid crystals of the touch display device 20 according to the factors.

Figure 4:
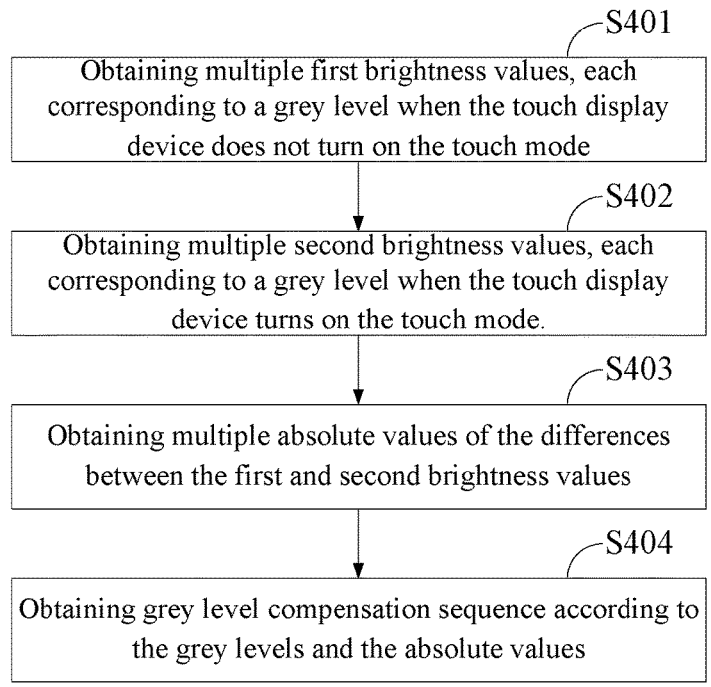
FIG. 4 is a flow diagram showing the obtaining of grey level compensation sequence of FIG. 1.

As shown in FIG. 4, the processing chip 21 obtains the grey level compensation sequence through the following steps.

Step S401: Obtaining multiple first brightness values, each corresponding to a grey level when the touch display device 20 does not turn on the touch mode.

The processing chip 21, when the touch display device 20 does not turn on the touch mode, obtains a first brightness value for each grey level. For example, the display panel 22 is able to display 256 different grey levels (from 0 to 255). The processing chip 21 then obtains a first brightness value for each of the 256 grey levels when the touch mode of the touch display device 20 is not turned on.

Step S402: Obtaining multiple second brightness values, each corresponding to a grey level when the touch display device 20 turns on the touch mode.

The processing chip 21, when the touch display device 20 turns on the touch mode, obtains a second brightness value for each grey level. For example, the processing chip 21 obtains a second brightness value for each of the 256 grey levels when the touch mode of the touch display device 20 is turned on.

Step S403: Obtaining multiple absolute values of the differences between the first and second brightness values corresponding to the same grey levels.

The processing chip 21 calculates and obtains an absolute value of the difference between a first brightness value and a second brightness value corresponding to a same grey level.

Step S404: Obtaining grey level compensation sequence according to the grey levels and the absolute values.

The processing chip 21 constructs and obtains the grey level compensation sequence according to the 256 grey levels and the absolute values corresponding to the 256 grey levels.

Step S105: If no, obtaining image data and extracting feature data from the image data.

When the processing chip 21 determines that the touch display device 20 has not turned on the touch mode, the processing chip 21 obtains image data and extracts feature data from the image data.

Step S106: Obtaining adjustment or compensation factors from the feature data.

The processing chip 21 calculates and obtains adjustment or compensation factors from the feature data.

Step S107: Adjusting control signal duty cycle of the touch display device according to the factors.

The processing chip 21 adjusts the touch display device 20's control signal duty cycle, and controls the brightness of the backlight module 23 according to the adjusted control signal.

The processing chip 21 further provides compensation to the liquid crystals of the touch display device 20 according to the factors.

As described above, the present embodiment increases the touch display device 20's brightness by the processing chip 21's adjustment to the control signal duty cycle so as to remedy the display difference for a same grey level image due to the turning on of the touch mode.

Figure 5:
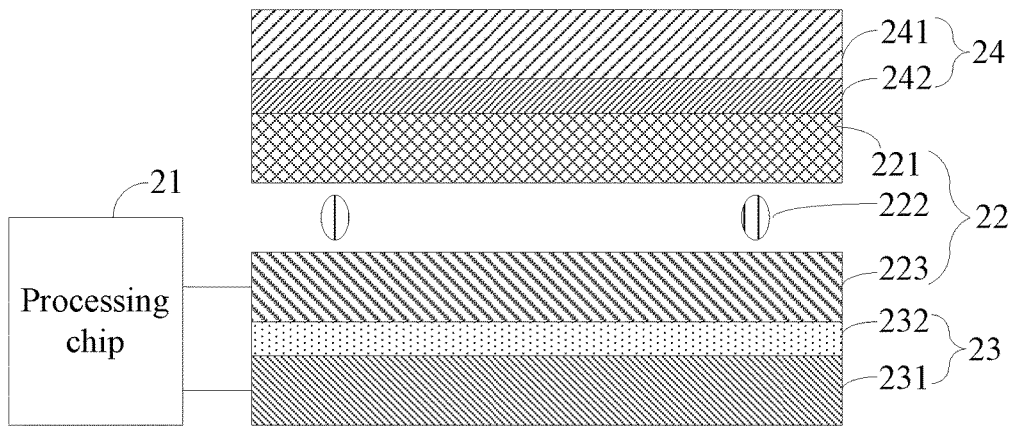
FIG. 5 is a schematic diagram showing a touch display device according to an embodiment of the present disclosure.

The present disclosure also teaches a touch display device embodying the above described improvement method. An embodiment of the touch display device 20, as shown in FIG. 5, further includes a touch panel 24 disposed immediately on the display panel 22.

The touch panel 24 includes a cover glass 241 and an upper polarization sheet 242. The upper polarization sheet 242 is disposed on the display panel 22, and the cover glass 241 is disposed on the upper polarization sheet 242.

The display panel 22 includes a color film substrate 221, liquid crystals 222, and an array substrate 223. The upper polarization sheet 242 is disposed on the color film substrate 221, the liquid crystals 222 are disposed between the color film substrate 221 and the array substrate 223. The processing chip 21 is connected to the array substrate 223.

The backlight module 23 includes a backlight 231 and a lower polarization sheet 232. The lower polarization sheet 232 is disposed to a side of the array substrate 223 away from the liquid crystals 222. The lower polarization sheet 232 is also positioned on the path of light emitted from the backlight 231. The processing chip 21 is further connected to the backlight 231. The processing chip 21 controls the brightness of the backlight module 23 through the backlight 231.

The processing chip 21 is for determining whether the touch display device 20 has turned on the touch mode. If the processing chip 21 determines that the touch display device 20 turns on the touch mode (i.e., the touch panel 24 is operating), the processing chip 21 obtains image data input to the touch display device 20 and extracts feature data from the image data.

The processing chip 21 then calculates and obtains adjustment or compensation factors according to the feature data. The processing chip 21 further obtains grey level compensation sequence and, according to the factors and the grey level compensation sequence, adjusts the touch display device 20's control signal duty cycle. The control signal is for controlling the brightness of the backlight module 23. That is, the processing chip 21 controls the brightness of the backlight module 23 of the touch display device 20 through controlling the brightness of the backlight 232 according to the adjusted control signal.

The processing chip 21 further conducts compensation to the liquid crystals 222 of the touch display device 20 according to the factors. That is, the processing chip 21 provides compensation to the liquid crystals 222 through the array substrate 223 according to the factors.

To obtain the grey level compensation sequence, the processing chip 21 obtains first brightness values, each corresponding to a grey level when the touch display device 20 does not turn on the touch mode. That is, the display panel 22 is capable of presenting 256 (0-255) grey levels and the processing chip 21 obtains a first brightness value for each of the 256 grey levels when the touch display device 20 does not turn on the touch mode.

The processing chip 21 then obtains second brightness values, each corresponding to a grey level when the touch display device 20 turns on the touch mode. That is, the processing chip 21 obtains a second brightness value for each of the 256 grey levels when the touch display device 20 turns on the touch mode.

The processing chip 21 then calculates and obtains an absolute value of the difference between a first brightness value and a second brightness value, both corresponding to a same grey level. The processing chip 21 constructs and obtains the grey level compensation sequence according to the 256 grey levels and their corresponding absolute values.

If the processing chip 21 determines that the touch display device 20 does not turn on the touch mode (i.e., the touch panel 24 is not operating), the processing chip 21 obtains image data and extracts feature data from the image data. The processing chip 21 then calculates and obtains adjustment or compensation factors according to the feature data and, according to the factors, adjusts the touch display device 20's control signal duty cycle. The processing chip 21 controls the brightness of the backlight module 23 of the touch display device 20 through controlling the brightness of the backlight 232 according to the adjusted control signal. The processing chip 21 then conducts compensation to the liquid crystals 222 of the touch display device 20 according to the factors. That is, the processing chip 21 provides compensation to the liquid crystals 222 through the array substrate 223 according to the factors.

As described above, the present disclosure first determines whether the touch display device turns on the touch mode. If yes, image data input to the touch display device is obtained and feature data is extracted from the image data. Then, adjustment or compensation factors and grey level compensation sequence are calculated and obtained. The duty cycle of the control signal for the touch display device is adjusted according to the factors and the grey level compensation sequence, so that the brightness of the backlight module of the touch display device is increased and thereby improves the display difference for a same grey level image due to the turning on of the touch mode.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. An improvement method for a touch display device, comprising
   determining whether the touch display device turns on the touch mode;
   if yes, obtaining image data input to the touch display device and extracting feature data from the image data;
   obtaining adjustment or compensation factors according to the feature data;
   obtaining a plurality of first brightness values, each corresponding to a grey level when the touch display device does not turn on the touch mode;
   obtaining a plurality of second brightness values, each corresponding to a grey level when the touch display device turns on the touch mode;
   obtaining a plurality of absolute values of the differences of the first brightness values and the corresponding second brightness values;
   obtaining grey level compensation sequence according to the grey levels and the absolute values;
   adjusting the duty cycle of the touch display device's control signal according to the factors and the grey level compensation sequence; and
   adjusting a backlight module's brightness of the touch display device according to the control signal of adjusted duty cycle.

2. The improvement method as claimed in claim 1, further comprising
   if no, obtaining image data and extracting feature data from the image data;
   obtaining adjustment or compensation factors according to the feature data; and
   adjusting the duty cycle of the touch display device's control signal according to the factors.

3. The improvement method as claimed in claim 1, further comprising providing compensation to the touch display device's liquid crystals according to the factors.

4. An improvement method for a touch display device, comprising
   determining whether the touch display device turns on the touch mode;
   if yes, obtaining image data input to the touch display device and extracting feature data from the image data;
   obtaining adjustment or compensation factors according to the feature data; and
   obtaining grey level compensation sequence and adjusting the duty cycle of the touch display device's control signal according to the factors and the grey level compensation sequence;
   wherein obtaining grey level compensation sequence comprises
   obtaining a plurality of first brightness values, each corresponding to a grey level when the touch display device does not turn on the touch mode;
   obtaining a plurality of second brightness values, each corresponding to a grey level when the touch display device turns on the touch mode;
   obtaining a plurality of absolute values of the differences of the first brightness values and the corresponding second brightness values; and
   obtaining the grey level compensation sequence according to the grey levels and the absolute values.

5. The improvement method as claimed in claim 4, further comprising
   if no, obtaining image data and extracting feature data from the image data;
   obtaining adjustment or compensation factors according to the feature data; and
   adjusting the duty cycle of the touch display device's control signal according to the factors.

6. The improvement method as claimed in claim 5, further comprising
   adjusting a backlight module's brightness of the touch display device according to the control signal of adjusted duty cycle.

7. The improvement method as claimed in claim 4, further comprising
   adjusting a backlight module's brightness of the touch display device according to the control signal of adjusted duty cycle.

8. The improvement method as claimed in claim 4, further comprising
   providing compensation to the touch display device's liquid crystals according to the factors.

9. A touch display device comprising a processing chip and a display panel, wherein the processing chip determines whether the touch display device turns on the touch mode;

if yes, the processing chip obtains image data input to the touch display device and extracts feature data from the image data; the processing chip then obtains adjustment or compensation factors according to the feature data; the processing chip further obtains grey level compensation sequence; and the processing chip adjusts the duty cycle of the touch display device's control signal according to the factors and the grey level compensation sequence;

wherein the processing chip obtains first brightness values, each corresponding to a grey level when the touch display device does not turn on the touch mode; the processing chip then obtains second brightness values, each corresponding to a grey level when the touch display device turns on the touch mode; the processing chip then obtains an absolute value of the difference between a first brightness value and a second brightness value, both corresponding to a same grey level; and the processing chip obtains the grey level compensation sequence according to the grey levels and the corresponding absolute values.

10. The touch display device as claimed in claim 9, wherein, if touch display device does not turn on the touch mode, the processing chip obtains image data and extracts feature data from the image data; the processing chip then obtains adjustment or compensation factors according to the feature data; and the processing chip adjusts the duty cycle of the touch display device's control signal according to the factors.

11. The touch display device as claimed in claim 10, further comprising a backlight module providing illumination to the display panel, wherein the processing chip adjusts the backlight module's brightness according to the control signal of adjusted duty cycle.

12. The touch display device as claimed in claim 10, wherein the processing chip further provides compensation to the touch display device's liquid crystals according to the factors.

13. The touch display device as claimed in claim 9, wherein the processing chip further provides compensation to the touch display device's liquid crystals according to the factors.

* * * * *